July 7, 1959 G. L. SCHNABLE 2,893,929

METHOD FOR ELECTROPLATING SELECTED REGIONS
OF N-TYPE SEMICONDUCTIVE BODIES
Filed Aug. 3, 1955

INVENTOR.
GEORGE L. SCHNABLE
BY
Allen U. Hogeline
ATTORNEY

United States Patent Office 2,893,929

Patented July 7, 1959

2,893,929

METHOD FOR ELECTROPLATING SELECTED REGIONS OF n-TYPE SEMICONDUCTIVE BODIES

George L. Schnable, Lansdale, Pa., assignor to Philco Corporation, Philadelphia, Pa., a corporation of Pennsylvania Application August 3, 1955, Serial No. 526,203

16 Claims. (Cl. 204—15)

Figure 2A:
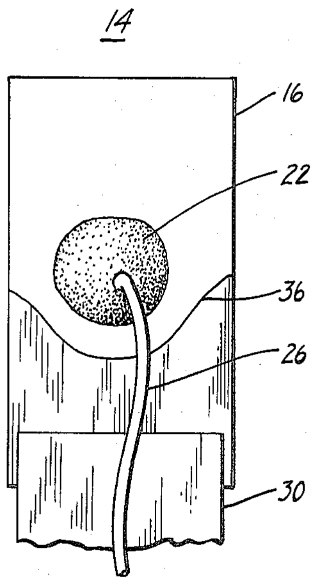

This invention relates to a method for fabricating a semiconductive device, and more specifically, to a method for selectively electroplating specific portions of a semiconductive body without electroplating other portions thereof.

In the fabrication of semiconductive devices, such as transistors, which include an n-type semiconductive body and a plurality of electrodes affixed thereto, it is often desirable to electroplate only specific portions of the semiconductive body near one electrode, without plating other portions thereof in the vicinity of another electrode. It is, for example, often highly desirable to plate the base portions of a p-n-p junction transistor or of an n-type surface-barrier transistor with a highly conductive metal, without permitting the plating to extend to within a predetermined small distance of either the emitter or collector elements thereof. Such plating of the base portions of the transistor serves to reduce the series base-lead resistance of the transistor, which in turn improves the high-frequency performance of the transistor and reduces the degree to which signals supplied to the base electrode are attenuated. The amplitudes of feedback signals which are developed across the base-lead resistance are also reduced by such plating, thereby increasing the overall output resistance of the transistor and decreasing the overall output capacitance thereof.

As aforementioned, it is important in this instance that the metal plated onto the base portion of the transistor shall not extend into contact with, or within a predetermined small distance of, either the emitter or the collector element, inasmuch as such an extension will in the first case short-circuit the contacted element to the base electrode, thereby rendering the transistor completely inoperative, or, in the second case, greatly impede the normal operation of the emitter or collector. Heretofore, it has been a relatively difficult matter to plate only the base portion of a transistor without also plating the emitter and collector. To accomplish the desired form of plating, the art has resorted to such expedients as masking each of the electrodes, as well as a small region surrounding each electrode, as with a suitable lacquer. Owing to the smallness of a transistor and the closeness with which the plating should desirably approach the emitter and collector electrodes, the application of lacquer thereto is a tedious, time consuming, and often imprecise operation, ill-suited to mass-production techniques. Moreover, even after the lacquer has been applied and the transistor plated, there may remain the task of removing the lacquer from the surfaces of the transistor, with the correlative danger that the surface of the transistor may be physically or chemically altered in a manner which is injurious to the operating characteristics of the transistor.

It is accordingly an object of the invention to provide an improved method for electroplating n-type semiconductive bodies.

Another object of the invention is to provide a method for selectively electroplating predetermined areas of n-type semiconductive bodies without electroplating other areas of these bodies.

A further object of the invention is to provide a novel method for fabricating transistors containing n-type material.

An additional object of the invention is to provide an improved method for electroplating the n-type portions of transistors without, however, electroplating either the emitter or collector portions thereof.

A still further object of the invention is to provide an inexpensive and operationally simple method for electroplating predetermined n-type areas of a transistor without electroplating other areas of said transistor.

Yet another object of the invention is to provide an improved method for electroplating specific areas of an n-type semiconductive body without electroplating other areas of said body, which method is particularly adapted to mass-production.

An additional object of the invention is to provide an improved method for electroplating the n-type base portion of a transistor without plating either the emitter or collector elements thereof, which method does not require the masking of portions of the transistor.

The above objectives are achieved through the provision of my novel plating method. in accordance with which a semiconductive structure, including a body of n-type material having an ohmic contacting element and an asymmetrically conductive element, has an electrolyte, containing ions of the metal to be plated, applied to the body in the region of the asymmetrically conductive element. Simultaneously, the ohmic contact is maintained at a potential negative with respect to the asymmetrically conductive element, by an amount greater than the deposition potential, in the aforesaid electrolyte, of the metal ions. By asymmetrically conductive element is meant one having a different resistance to an electric current flowing through it in one direction than to a current flowing through it in the other direction. In one instance this element may comprise a metallic contact applied to the semiconductive body. Alternatively it may comprise a second body of semiconductive material having a boundary contiguous with a region of the n-type semiconductive body.

In a preferred embodiment, in which my method is utilized to plate a base contact onto a transistor, the electrolyte may be applied to the entire surface of the transistor, including the emitter and collector elements as well as the base tab. In this arrangement, the base tab, which is substantially ohmically affixed to the n-type semiconductive body, serves as the aforesaid ohmic contacting element, while the emitter and collector elements of the transistor are connected together to serve as the asymmetrically conductive element. Accordingly, the base tab is maintained at a potential negative with respect to the emitter and collector electrodes by an amount exceeding the aforesaid deposition potential of the metal ions.

Under these conditions, the metal ions contained in the electrolyte plate onto that portion of the surface of the semiconductive body to which the electrolyte has been applied, and which lies outside of a predetermined region surrounding the positively-poled asymmetrically conductive element. The inhibition of plating within this predetermined region is believed to be produced as the result of certain fundamental physical characteristics of the plated body which are peculiar to n-type semiconductive substances, as will be described in detail hereinafter.

Figure 2B:
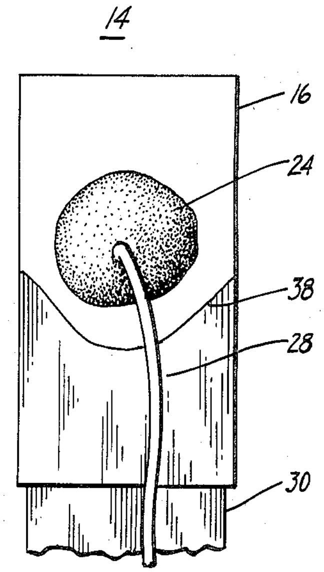
Figure 1:
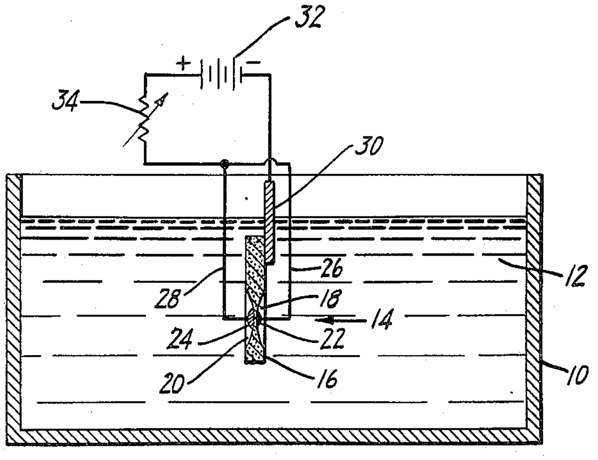

Other advantages and features of the invention will become apparent from a consideration of the following detailed description taken in connection with the accompanying drawings, in which:

Figure 1 illustrates diagrammatically an electroplating arrangement suitable for use in practicing the invention; and Figures 2A and 2B illustrate diagrammatically and respectively the two electrode-bearing surfaces of a surface-barrier transistor plated by the method of the invention.

Figure 1 shows an electroplating arrangement for selectively electroplating specific portions of an n-type semiconductive body without electroplating other portions thereof. More specifically, there is shown a vessel 10, which may be made of an inert insulating material such as glass. Vessel 10 contains a metal-plating solution 12 which, in the present embodiment, is a gold-plating solution. The composition of solution 12 is discussed in greater detail hereinafter. Immersed in plating solution 12 is a semiconductive structure (see also Figures 2A and 2B) which, in the specific embodiment of my invention discussed herein, is a surface-barrier transistor 14.

Transistor 14 comprises a substantially rectangular body 16 of n-type germanium having substantially coaxial depressions 18 and 20, respectively, formed on opposing surfaces thereof. In these respective depressions, there have been plated a surface-barrier emitter electrode 22 and a surface-barrier collector electrode 24, each of which may be formed of the material indium. Connecting lead wires 26 and 28, respectively, which are composed preferably of nickel, have been soldered to emitter electrode 22 and collector electrode 24, respectively, while a nickel base tab 30 has been soldered to one end of semiconductive body 16. The solder employed in each of these operations may be composed principally of tin, and serves to make a substantially ohmic contact. It is then the purpose of the invention, in this embodiment, to provide an electroplated base contact extending from tab 30 up to predetermined distances from emitter electrode 22 and collector electrode 24, respectively.

To energize this electroplating process, there is provided a source of direct voltage 32. In accordance with the invention, the negative pole of source 32 is connected directly to the base tab 30 of transistor 14, while the positive pole of source 32 is connected, via a variable resistor 34 and leads 26 and 28, to both the emitter electrode 22 and the collector electrode 24 of the transistor. Source 32 is arranged to develop, between electrodes 22—24 and base tab 30, a voltage in excess of the deposition potential of gold, but preferably less than that causing rapid evolution of hydrogen and oxygen. In practice, a source which establishes a potential difference of about 1.5 volts between electrodes 22—24 and base tab 30 is found to be satisfactory. However, a potential difference as low as 1 volt may be used. Voltages in excess of 3 volts have been found to produce undesirable coarse-grained deposits, and, for this reason, voltages less than 3 volts are preferred. By utilizing such potential differences, gold plating is produced on the surfaces of body 16, which plating extends away from base tab 30 only as far as boundaries 36 and 38, as shown in Figures 2A and 2B and as described more fully hereinafter in connection with the latter figures.

In one form, the semiconductive body 16 of transistor 14 may be composed of that n-type germanium which has a bulk resistivity ranging from 2.5 to 4.0 ohm-centimeters and a bulk hole lifetime of about 200 microseconds. Depressions 18 and 20 and plated electrodes 22 and 24 may be formed by utilizing the jet electrolytic process described in detail in the copending patent application Serial No. 472,824 of J. W. Tiley and R. A. Williams, filed December 3, 1954, entitled "Semiconductive Devices and Methods for the Fabrication Thereof," and assigned to the assignee of the present application. Accordingly, no further discussion of this process is deemed necessary herein. Moreover, specific details regarding the structure of surface-barrier transistor 14 are discussed in the copending patent application Serial No. 472,826 of R. A. Williams and J. W. Tiley, filed December 3, 1954, entitled "Electrical Device," and assigned to the assignee of the present application. Accordingly, no further discussion of the structure of transistor 14 is deemed necessary herein.

In carrying out my method, I have found it desirable to perform certain steps before and after performing the novel plating operation indicated in Figure 1. More specifically, before arranging transistor 14 in the manner illustrated in Figure 1, I have found it desirable to cleanse the surfaces of the transistor. This cleansing may be performed in any one of several ways. For example, the transistor may be cleansed by electrolytic etching. In this process, the transistor is immersed in a concentrated (e.g. 5 normal) solution of sodium or potassium hydroxide which is maintained at a temperature of 80° C. A potential difference of about 3 volts is then applied between electrodes 22 and 24 respectively, and base tab 30. This potential difference is poled so as to maintain electrodes 22 and 24 positive with respect to tab 30. The electrolysis is continued for about 10 seconds, after which the potential difference is removed from electrodes 22—24 and tab 30, and the transistor is taken out of the hydroxide solution and rinsed for about one minute under running distilled water.

Alternatively, the cleansing may be performed without the use of an electric current, by immersing the transistor for five seconds in an etching solution consisting of five parts-by-volume of concentrated nitric acid (70 percent $HNO_3$ by weight), five parts-by-volume of concentrated hydrofluoric acid (48 percent HF by weight), and one part-by-volume of distilled water. After this immersion, the transistor is rinsed under running distilled water for about one minute.

After the surfaces of transistor 14 have been cleansed, the electrodes of the transistor are connected as shown in Figure 1, and the transistor is immersed in gold-plating solution 12. The composition of this gold-plating solution is not critical; various gold-plating solutions well-known in the plating art may be used. One such plating solution, suitable for use at room temperature, e.g. 25° C., has the following composition:

| | Grams |
|---|---|
| $KAu(CN)_2 \cdot 2H_2O$ | 3.5 |
| KCN | 14 |
| $Na_2HPO_4 \cdot 12H_2O$ | 4 |
| $(NaOOCH_2C)_2N(CH_2)_2N(CH_2COONa)_2$ | 10 |
| $H_2O$ to make 1 liter of solution. | |

As aforementioned, leads 26 and 28 of transistor 14 are composed of the metal nickel, which has substantially no tendency to react with this plating solution or to etch under the influence of the electric current supplied by source 32. It is therefore unnecessary to insulate leads 26 and 28 from electrical contact with plating solution 12. In this regard, it is usually important to insulate leads 26 and 28 only in those instances wherein these leads are composed of a reactive metal, e.g. copper, which, when positively poled, tends to etch and to deposite on the negatively-poled transistor surface. In such instances, leads 26 and 28 can be insulated from plating solution 12 by coating the leads with paraffin wax or by enclosing each of them within an insulating sleeve (not shown) which may, for example, be constructed of glass.

As mentioned hereinbefore, for a plating solution having the aforedescribed composition, the plating process may be carried out at room temperature, i.e., at about 25° C., with a potential difference of 1.5 volts applied between electrodes 22—24 and base tab 30. Under these conditions, gold is deposited upon all those portions of the base tab 30 which are immersed in solution 12 and upon only certain portions of the surfaces of semiconductive body 16. In this regard, particular reference is now made to Figures 2A and 2B, which are diagrammatic sketches derived from microphotographs, of a transistor plated according to my novel method. As shown in Figure 2A, on that surface of transistor 14 having emitter electrode 22 formed thereon, the gold plates only in the region which lies between base tab 30 and the perimeter of emitter electrode 22 and, importantly, does not extend into contact with electrode 22 but terminates at predetermined boundary 36. Similarly and as shown in Figure 2B, on that surface of transistor 12 having collector electrode 24 formed thereon, the gold deposits on body 16 only in the region which lies between base tab 30 and collector electrode 24, the plating terminating at predetermined boundary 38 which does not touch electrode 24. Moreover, it is found that the boundaries 36 and 38 cannot be made to approach substantially closer to electrodes 22 and 24, respectively, by continuing the plating process for much longer periods than the above-specified two minutes, e.g. for two hours. The factors which are believed to produce this selective plating pattern are considered in detail hereinafter.

After the plating process has been completed, transistor 14 is disconnected from source 32 and is rinsed for 30 seconds in running distilled water. To cleanse thoroughly the still-exposed germanium surfaces of the transistor, thereby to obtain superior and more uniform operating characteristics between successive transistors processed according to my invention, the transistor is dipped into concentrated hydrofluoric acid for 1 second. It is then rinsed for one minute in running distilled water and is dried in a vacuum. The cleansing is completed by immersing the transistor for 10 seconds in the aforedescribed etching solution comprising concentrated hydrofluoric and nitric acids, by removing the transistor from this etchant, by rinsing it for one minute in running distilled water, and by drying the transistor, preferably in a vacuum.

As set forth hereinbefore, a highly desirable result of gold-plating a transistor in the aforedescribed manner is the reduction of the base-lead resistance of the transistor. I have found in practice that a surface barrier transistor which is gold-plated in accordance with my novel method exhibits an average decrease in base-lead resistance of over 13 percent, with concomitant improvements in its operating characteristics as compared to those of an unplated transistor.

While I do not wish to be bound by the specific details of any theory, the following theoretical considerations are set forth in order that the invention and its modes of applications may be more fully understood.

There are believed to be three major parameters which determine, for an n-type semiconductive body having a given geometry and a given electrode placement, over what area of the semiconductive body the plated metal will deposit, i.e. where the boundaries 36 and 38 will be positioned on body 16. These parameters are:

(1) The values of the bulk and surface resistivities of the semiconductive body, (2) The value of the reverse-resistance per unit area of a rectifying barrier formed between the deposited metal and the germanium surface upon which it is deposited, and (3) The quantity and lifetime of holes injected into the semiconductive body by the positively-poled contacting element.

More specifically, one factor determining the positions of boundaries 36 and 38 are the substantial bulk and surface resistivities possessed by semiconductive body 16. Because body 16 has these substantial resistivities, as well as a very small cross-sectional area, there is a potential drop along the surface of the body 16, between base tab 30 and electrodes 22—24, such that a region exists on this surface within which the potential is less negative than the deposition potential of the metal to be plated. Within this region no plating can occur. However, this single factor of resistivity is apparently not sufficient to explain why the plating stops at an appreciable distance from electrodes 22 and 24. More particularly, if mere resistivity were the only operative mechanism, then, as the gold deposited on the surface of body 16, it would substantially short-circuit that portion of the germanium surface underlying it. As a result, the periphery of the plated area would at all times be at an electric potential substantially equal to that of the base tab 30, i.e., a potential exceeding the deposition potential of gold, and the region in which the potential was less negative than the deposition potential would, as a result, be progressively constricted toward electrodes 22 and 24. Consequently, additional gold would continue to plate on the germanium surface at points lying outside of the aforesaid periphery, until the entire surface, from base tab 30 to positively-poled electrodes 22—24, was plated; however, this type of plating does not in fact occur.

However, on the basis of experimental evidence, it is believed that a rectifying barrier is formed between the gold and the underlying semiconductive material; this rectifying barrier is forward-biased when the gold is maintained at a potential positive with respect to that of the germanium body, and is reverse-biased when the gold is maintained at a potential negative with respect to that of the body. Since, during plating, the gold is biased slightly negative with respect to the underlying germanium surface, the rectifier formed by the gold and the underlying germanium is reverse-biased, and there is consequently a substantial resistance, per unit area of plated germanium surface, to the flow of an electric current between the gold and the germanium. Because of this substantial barrier resistance, as well as the appreciable resistivity of the germanium, there is an appreciable voltage drop along even that portion of the germanium surface which lies beneath the gold plating. The existence of this voltage drop beneath the plated gold makes possible the existence of boundaries (i.e., boundaries 36 and 38) along each of the respective surfaces of semiconductive body 16, between base tab 30 and either electrode 22 or electrode 24, at which the surface voltage just equals the potential required to deposit gold. Between each of these boundaries and the appropriate positively-poled electrodes 22 and 24, the voltage is insufficiently negative to deposit gold and, as a result, no plating occurs. The position of each boundary therefore is dependent, at least in part, on the relative values of the reverse-biased resistance per unit area of the aforementioned rectifying barrier between the gold and the germanium, and the resistivity of the germanium per se, as well as upon the value of the voltage applied between contacts 22—24 and base tab 30.

However, the respective positions of boundaries 36 and 38 are believed to depend on yet another set of factors. These factors are the quantity and the lifetime of minority carriers, i.e. holes, injected into body 16 by surface-barrier electrodes 22 and 24, under the influence of the positive voltage applied thereto. When a hole is injected into germanium, i.e. when an electron is extracted from the valence band of the germanium, the potential of the germanium at the position of the hole rises by an amount equal to the width of the so-called forbidden band, i.e. about 0.7 volt. In those cases where a substantial quantity of holes is injected into the germanium, an appreciable number of these holes diffuse from the interior of the germanium to the surface thereof, and make the potential of the germanium surface more positive by the aforementioned 0.7 volt. As a result, in the vicinity of each hole-injecting source, there is established a region in which the presence of holes on the surface of the germanium raises the potential of the surface to such a positive value that plating is inhibited in that region.

However, I have found that plating boundaries, such as 36 and 38, which are spaced from positively-poled electrodes, can be obtained even where the positively-poled electrodes are constituted of a material which is not generally considered to be an efficient hole injector. For example, I have found experimentally that such a boundary is formable on n-type germanium even when the positively-poled contact is constituted of the metal tin, fused to the germanium. Such tin contacts are generally believed to have substantially ohmic properties, as contrasted with the excellent rectifying and hole-injecting properties of indium surface-barrier contacts. However, I believe that the positively-poled tin contact does in fact inject a substantial quantity of holes in the germanium body, thus tending to prevent plating in the immediate vicinity of the contact.

As mentioned hereinbefore, substantially no gold is plated on those portions of the surface of semiconductive body 16 which are more remote from base tab 20 than boundaries 36 and 38, respectively. This lack of plating is believed to be caused by the fact that, owing to the geometry of the semiconductive structure, those components of the current flowing between contacts 22 and 24 and base tab 30, which flow through the latter surface portions, have relatively low intensities. Therefore, the voltage drop between electrodes 22 and 24 and any point located within these surface portions is too small to render the surface sufficiently negative to cause gold to deposit thereon.

In the preferred embodiment, the desired form of plating (i.e. plating spaced by an appreciable distance from electrodes 22 and 24 respectively) is obtained by connecting both of these electrodes to the positive terminal of source 32, and by connecting the negative terminal of this source to base tab 30. However, I have found that, owing to the geometry of transistor 14, the same plating pattern may be obtained by connecting only one of the electrodes 22—24, e.g. collector electrode 24, to the positive terminal of source 32. This is true because that portion of semiconductive body 16 interposed between the substantially coaxial electrodes 22 and 24 is very thin, e.g. of the order of 0.0002 inch, while the thickness of other portions of body 16 may be of the order of only 0.002 inch. As a result, the resistance between the two electrodes is small. Consequently, when a positive potential is supplied to an electrode affixed to one surface of body 16, e.g. collector electrode 24, the resultant potential of the surface of body 16 opposite to that to which electrode 24 is affixed, i.e. the surface contiguous with emitter electrode 22, is at substantially the same potential as the surface underlying electrode 24. As a result, the potential distribution along each of the surfaces of body 16 are substantially the same, and the plating pattern is substantially the same.

Moreover, it will be understood that my novel plating process is by no means limited to plating the base portions of transistors, but may also be used, for example, to plate predetermined regions surrounding, but not contacting, the anode terminal of a semiconductive diode. Such plating is particularly useful where the diode is to be operated at high frequencies. In particular, such plating of the semiconductive surfaces of a diode acts to lower its forward resistance, while not substantially reducing its reverse resistance. The decrease in forward resistance, brought about by plating the semiconductive body, improves substantially the high-frequency performance of the diode in manners well-known to those skilled in the art.

In addition, it is clear that an external anode may be used to supplement the anodic action at electrodes 22 and 24, by causing particularly heavy plating to occur in designated regions as determined by the geometry of the external anode and its position relative to the semiconductive body. This anode may be constituted of an inert material, e.g. carbon, or, alternatively, may be a consumable gold anode. It is to be understood however, that such an anode is not required to carry out the method according with my invention.

It will also be understood that, while in the above-described embodiment of the invention, the emitter and collector elements 22 and 24 respectively are in the form of metal contacts, each may instead comprise a p-type body of semiconductive material contiguous with a corresponding portion of body 16. Such bodies are readily provided by the utilization of techniques well-known to those skilled in the art of alloy-junction transistor fabrication.

In addiion, while the semiconductive body 16 described in the preferred embodiment is constituted of germanium, it will be understood that this body need not be composed of this material, but may alternatively be composed of a different n-type semiconductive material, e.g. n-type silicon.

While I have described my invention by means of specific examples and in a specific embodiment, I do not wish to be limited thereto, for obvious modifications will occur to those skilled in the art without departing from the scope of my invention.

What I claim is:

1. The method of gold-plating an n-type semiconductive body, to one area of which has been applied an ohmic contacting element and to another area of which has been applied a rectifying contacting element, said method comprising the steps of: applying between said ohmic and rectifying elements a potential difference such that said rectifying element is more positive than said ohmic element, thereby to create a non-platable region surrounding said rectifying element and extending a predetermined finite distance beyond the perimeter of said rectifying element; and applying an electrolytic solution containing gold ions to an area of said body extending into said non-platable region, said potential difference having a magnitude exceeding the deposition potential in said solution of said ions.

2. The method of metal-plating an n-type semiconductive body having a substantially ohmic contacting element applied to a first region of said body and having a barrier-forming element contiguous to a second region of said body separated from said first region, said barrier-forming element producing a rectifying barrier in said second region, said method comprising the steps of: applying an electrolyte, containing ions of said metal to be plated, to a region of said body including at least a portion of said barrier-forming element; and applying between said two elements a potential difference having a magnitude exceeding the deposition potential in said electrolyte of said ions and having a polarity such that said barrier-forming element is more positive than said ohmic element.

3. The method of claim 2, wherein said semiconductive body is composed of n-type germanium, and said ions of said metal to be plated are gold ions.

4. The method of metal-plating an n-type semiconductive body having a substantially ohmic contacting element applied to a first region of said body and having a barrier-forming element contiguous to a second region of said body separated from said first region, said barrier-forming element producing a rectifying barrier in said second region, said method comprising the steps of: bathing a region of said body extending continuously between said ohmic and barrier-forming elements with an electrolyte containing ions of said metal to be plated; and applying between said two elements a potential difference having a magnitude exceeding the deposition potential in said electrolyte of said ions and having a polarity such that said barrier-forming element is more positive than said ohmic element.

5. The method of claim 4, wherein said body is composed of n-type germanium, and said ions of said metal to be plated are gold ions.

6. The method of gold-plating a body of n-type germanium, to one region of which has been applied a substantially ohmic contacting element and to a second region of which, separated from said first region, has been applied a rectifying element, said method comprising the steps of: immersing said body, said rectifying element and at least a portion of said ohmic element in an electrolytic solution containing gold ions; and applying a potential difference between said ohmic and rectifying elements while said body, rectifying element and portion of said ohmic element are immersed in said solution, said potential difference having a magnitude greater than the deposition potential in said solution of said gold ions and having a polarity such that said rectifying element is more positive than said ohmic element.

7. The method of gold-plating according to claim 6, wherein said method additionally includes the step of cleansing the surfaces of said germanium body prior to said step of immersing said body in said electrolytic solution, and the step of cleansing said surfaces after said body has been removed from said electrolytic solution; and wherein said rectifying element comprises a surface-barrier electrode applied to said second region and said potential difference has a value in the range of 1 to 3 volts.

8. In the art of fabricating a semiconductor device of the type comprising an n-type semiconductive body having applied thereto an ohmic contacting element and an asymmetrically conductive element separated from said ohmic contacting element, the method of depositing metal substantially only over a portion of the surface of said n-type body spaced from said asymmetrically conductive element, said method comprising the steps of: applying an electrolyte, containing ions of said metal to be deposited, to a region of said n-type body including said surface portion; applying between said ohmic and asymmetrically conductive elements a potential difference having a magnitude exceeding the deposition potential in said electrolyte of said ions and having a polarity such that said asymmetrically conductive element is more positive than said ohmic element, thereby to create a non-platable region surrounding said asymmetrically conductive element and extending a finite distance beyond the perimeter of said asymmetrically conductive element; and maintaining said potential difference until said metal deposits on said surface portion.

9. In the art of fabricating a semiconductor device of the type comprising an n-type semiconductive body having applied thereto an ohmic contacting element and an asymmetrically conductive element separated from said ohmic contacting element, the method of depositing metal substantially only over a portion of the surface of said n-type body spaced from said asymmetrically conductive element, said method comprising the steps of: applying an electrolyte, containing ions of said metal to be deposited, to a region of said n-type body including said surface portion and to at least a portion of said asymmetrically conductive element; applying between said ohmic and asymmetrically conductive elements a potential difference having a magnitude exceeding the deposition potential in said electrolyte of said ions and having a polarity such that said asymmetrically conductive element is more positive than said ohmic element, thereby to create a non-platable region surrounding said asymmetrically conductive element and extending a finite distance beyond the perimeter of said asymmetrically conductive element; and maintaining said potential difference until said metal deposits on said surface portion.

10. In the art of fabricating a semiconductive device of the type comprising an n-type semiconductive body having applied thereto an ohmic contacting element and an asymmetrically conductive element separated from said ohmic contacting element, the method of depositing metal substantially only over a portion of the surface of said n-type body spaced from said asymmetrically conductive element, said method comprising the steps of: bathing a region of said n-type body extending continuously between said ohmic and asymmetrically conductive elements with an electrolyte containing ions of said metal to be deposited; applying between said ohmic and asymmetrically conductive elements a potential difference having a magnitude exceeding the deposition potential in said electrolyte of said ions and having a polarity such that said asymmetrically conductive element is more positive than said ohmic element, thereby to create a non-platable region surrounding said asymmetrically conductive element and extending a finite distance beyond the perimeter of said asymmetrically conductive element; and maintaining said potential difference until said metal has deposited on said surface portion.

11. The method of claim 10, wherein said metal is one which forms a rectifying barrier in said semiconductive body when applied thereto.

12. The method of claim 10, wherein said body is composed of n-type germanium, and said ions of said metal to be plated are gold ions.

13. The method of claim 10, wherein said step of applying said electrolyte to said continuously-extending region of said body comprises the step of immersing said body and a least a portion of each of said ohmic and asymmetrically conductive elements in said electrolyte.

14. In the art of fabricating a transistor of the type comprising an n-type semiconductive body having attached thereto opposing, asymmetrically conductive emitter and collector electrodes and a substantially ohmic contact, the method of electrodepositing metal substantially only over a portion of said n-type body extending from said contact to boundaries spaced from said emitter and collector electrodes, said method comprising the steps of: immersing said n-type body, said electrodes and at least a portion of said contact in an electrolytic solution containing the ions of a metal to be deposited; applying a voltage between at least one of said electrodes and said contact while said body, electrodes and portion of said contact are immersed in said solution, said voltage having a value exceeding the deposition potential in said solution of said ions and having a polarity such that said one electrode is at a potential positive with respect to that of said contact, thereby to create non-platable regions surrounding said emitter and collector electrodes and extending respective finite distances beyond the respective perimeters of said electrodes; and maintaining said voltage until said metal has deposited on said portion.

15. The method of claim 14, wherein said step of applying a voltage between at least one of said electrodes and said substantially ohmic contact includes the step of applying a voltage between each of said electrodes and said substantially ohmic contact while said body, electrodes and portion of said substantially ohmic contact are immersed in said solution, said last-named voltage having a value exceeding the deposition potential in said solution of said ions and having a polarity such that each of said electrodes is more positive than said substantially ohmic contact.

16. The method of claim 14, wherein said semiconductive body is constituted of n-type germanium and said emitter and collector electrodes are each a surface-barrier electrode deposited on said body, and wherein said ions are gold ions.

References Cited in the file of this patent

UNITED STATES PATENTS

| | | |
|---|---|---|
| 2,584,623 | Schneider | Feb. 5, 1952 |
| 2,656,496 | Sparks | Oct. 20, 1953 |
| 2,694,040 | Davis et al. | Nov. 9, 1954 |
| 2,695,930 | Wallace | Nov. 30, 1954 |
| 2,705,767 | Hall | Apr. 5, 1955 |

OTHER REFERENCES

Monthly Review, Savage, April 1942, pp. 301 to 307.